(12) United States Patent
Toita et al.

(10) Patent No.: US 11,805,367 B2
(45) Date of Patent: Oct. 31, 2023

(54) SPEAKER

(71) Applicant: Alps Alpine Co., LTD, Tokyo (JP)

(72) Inventors: Hiroki Toita, Fukushima (JP); Ryosuke Tachi, Fukushima (JP); Ryo Ito, Fukushima (JP)

(73) Assignee: Alps Alpine Co., Ltd., Tokyo (JP)

( * ) Notice: Subject to any disclaimer, the term of this patent is extended or adjusted under 35 U.S.C. 154(b) by 0 days.

(21) Appl. No.: 17/734,319

(22) Filed: May 2, 2022

(65) Prior Publication Data

US 2023/0164491 A1 May 25, 2023

(30) Foreign Application Priority Data

Mar. 25, 2021 (JP) .................................. 2021-051732

(51) Int. Cl.
| | |
|---|---|
| *H04R 9/06* | (2006.01) |
| *H04R 9/02* | (2006.01) |
| *G01R 33/07* | (2006.01) |
| *H04R 1/28* | (2006.01) |
| *H04R 9/04* | (2006.01) |
| *H04R 29/00* | (2006.01) |
| *H04R 3/00* | (2006.01) |

(52) U.S. Cl.
CPC ........... *H04R 9/027* (2013.01); *G01R 33/072* (2013.01); *H04R 1/2803* (2013.01); *H04R 3/002* (2013.01); *H04R 9/025* (2013.01); *H04R 9/046* (2013.01); *H04R 9/06* (2013.01); *H04R 29/001* (2013.01); *H04R 2400/11* (2013.01)

(58) Field of Classification Search
CPC ...... H04R 1/2803; H04R 3/002; H04R 3/005; H04R 7/12; H04R 9/02; H04R 9/025; H04R 9/027; H04R 9/046; H04R 9/06; H04R 29/001; H04R 2400/11
See application file for complete search history.

(56) References Cited

U.S. PATENT DOCUMENTS 4,256,923 A * 3/1981 Meyers .................. H04R 3/002
  381/96
4,821,328 A * 4/1989 Drozdowski .......... H04R 3/002
  381/59

(Continued)

FOREIGN PATENT DOCUMENTS

| DE | 32 37 262 C1 | 10/1983 |
| EP | 0107777 | 5/1984 |

(Continued)

OTHER PUBLICATIONS

Extended European Search Report from corresponding European Application No. 22168467.3, dated Oct. 17, 2022, 14 pp.

(Continued)

*Primary Examiner* — Huyen D Le
(74) *Attorney, Agent, or Firm* — Crowell & Moring LLP

(57) ABSTRACT

A vibrating unit includes a diaphragm and a bobbin, and a voice coil is secured to the bobbin. A detecting unit includes a moving magnet and a magnetic sensor. An annular magnet support is secured to a front edge of the bobbin, and the moving magnet is positioned and secured to the magnet support. The magnetic sensor is secured to a drive supporting unit. The moving magnet is secured to the bobbin, with the magnet support therebetween. This facilitates mounting and positioning of the moving magnet.

19 Claims, 9 Drawing Sheets

(56) References Cited

U.S. PATENT DOCUMENTS 6,574,346 B1    6/2003   Tanaka
2022/0312135 A1*   9/2022   Tachi .................. H04R 29/001

FOREIGN PATENT DOCUMENTS

| EP | 1049353 A2 | 11/2000 |
| JP | 57-184397 | 11/1982 |
| JP | 2000-308174 A | 11/2000 |

OTHER PUBLICATIONS

Written Opinion of the International Searching Authority from corresponding International Application No. PCT/JP2022/017857, dated Jul. 12, 2022, 16 pp.

* cited by examiner

SPEAKER

RELATED APPLICATION

The present application claims priority to Japanese Patent Application Number 2021-051732, filed Mar. 25, 2021, the entirety of which is hereby incorporated by reference.

BACKGROUND

1. Field of the Invention

The present invention relates to a speaker that is capable of detecting, with a magnetic sensor, the operation of a vibrating unit including a diaphragm and a bobbin.

2. Description of the Related Art

Speakers for acoustic systems according to the related art are configured only to perform processing which involves simply receiving an audio signal output from an amplifier and reproducing sound pressure. That is, since the speakers are not configured to perform a control operation in accordance with an audio signal, the resulting sound tends to be distorted and the sound quality tends to vary. Additionally, when the amplitude of a diaphragm is excessively large, the diaphragm or a damper may be damaged.

As a solution to the problems described above, JP 57-184397 A discloses a speaker system that is configured to perform feedback control by detecting the movement of a diaphragm with a magnetic sensor.

The speaker system includes a Hall element serving as a magnetic sensor. At a position opposite a voice coil, the Hall element is supported by a plate constituting a magnetic circuit unit. An effective magnetic flux density inside a gap in the magnetic circuit unit is detected by the Hall element, and the detection signal is amplified and sent as feedback to a power amplifier. When a driving current applied from the power amplifier to the voice coil causes a bobbin to vibrate together with the voice coil, the effective magnetic flux density in the gap is changed by current flowing in the voice coil and counter-electromotive force generated in the voice coil. The change in the effective magnetic flux density is detected by the Hall element and sent as feedback to the power amplifier, so that distortion in the driving current applied to the voice coil is corrected.

In the feedback control performed in the speaker system disclosed in JP 57-184397 A, the Hall element smaller than an optical detector element and a coil is used as a detector element. This prevents an excessive increase in the size of the speaker and prevents an increase in power consumption. With the technique in which the Hall element detects a change in the effective magnetic flux density inside the gap in the magnetic circuit unit, however, the movement of the voice coil and the bobbin cannot be directly detected. This makes it difficult to highly precisely correct sound distortion and variation in sound quality.

The speaker system disclosed in JP 57-184397 A has a structure in which the Hall element is embedded in a surface of the plate facing the voice coil. The Hall element has a complex installation structure and cannot be assembled efficiently.

The present disclosure has been made to solve the problems of the related art described above. An object of the present disclosure is to provide a speaker that is capable of highly precisely detecting vibration of a vibrating unit using a moving magnet and a magnetic sensor, and is structured to allow the moving magnet to be easily attached to a movable unit.

SUMMARY

A speaker according to an aspect of the present disclosure includes a vibrating unit and a drive supporting unit. The vibrating unit includes a diaphragm supported by a frame, a bobbin configured to vibrate with the diaphragm, and a voice coil disposed on the bobbin. The drive supporting unit includes the frame and a magnetic circuit unit configured to apply a magnetic flux to the voice coil. The speaker includes a detecting unit including a moving magnet and a magnetic sensor. A magnet support made of a non-magnetic material is attached to the bobbin having a circular cylindrical shape. The magnet support extends along at least part of the bobbin in a circumferential direction. The moving magnet is secured to the magnet support, and the magnetic sensor is secured to the drive supporting unit.

In the speaker according to the aspect of the present disclosure, the magnet support preferably has an annular shape extending along an entire circumference of the bobbin.

In the speaker according to the aspect of the present disclosure, a balancing mass is preferably secured to the magnet support. The balancing mass is configured to eliminate imbalance in mass caused by securing the moving magnet to the magnet support.

In the speaker according to the aspect of the present disclosure, the magnet support is attached to extend along a front edge of the bobbin. The front edge is on a side of the bobbin opposite the voice coil.

In the speaker according to the aspect of the present disclosure, a phase plug supported by the magnetic circuit unit is provided in a region surrounded by the bobbin. An inner periphery of the magnet support can serve as a positioning portion that determines a relative position with respect to the phase plug.

In the speaker according to the aspect of the present disclosure, the magnet support may be secured to an outer periphery of the bobbin in a middle part of the bobbin in a front-back direction.

For example, a damper member may be provided between the frame and the bobbin, and the magnet support may be attached to extend along a joint between the bobbin and the damper member.

Alternatively, the magnet support may be attached to extend along a joint between the bobbin and the diaphragm.

In the speaker according to the aspect of the present disclosure, a direction of a magnetic field applied from the magnetic circuit unit to the magnetic sensor preferably crosses a direction of a magnetic field applied from the moving magnet to the magnetic sensor. A detection output based on a change in a direction of a composite vector of the two magnetic fields is preferably obtained from the magnetic sensor.

In the speaker according to the aspect of the present disclosure, the magnetic sensor detects a magnetic flux from the moving magnet disposed on the bobbin, which is part of the vibrating unit. The movement of the vibrating unit can thus be directly detected. This enables highly precise feedback control for correcting the operation of the vibrating unit. The magnetic sensor provides a detection output based on a change in the direction of the composite vector of the magnetic field of a leakage magnetic flux from the magnetic circuit unit and the magnetic field from the moving magnet.

The movement of the vibrating unit can thus be detected with high precision, regardless of the intensity of the driving magnetic flux generated from the magnetic circuit unit.

The magnet support made of a non-magnetic material and extending along at least part of the circular cylindrical bobbin in the circumferential direction is attached to the bobbin, and the moving magnet is secured to the magnet support. The moving magnet can thus be accurately positioned and secured to the bobbin formed of a thin material.

DETAILED DESCRIPTION OF THE PREFERRED EMBODIMENTS

Figure 1:
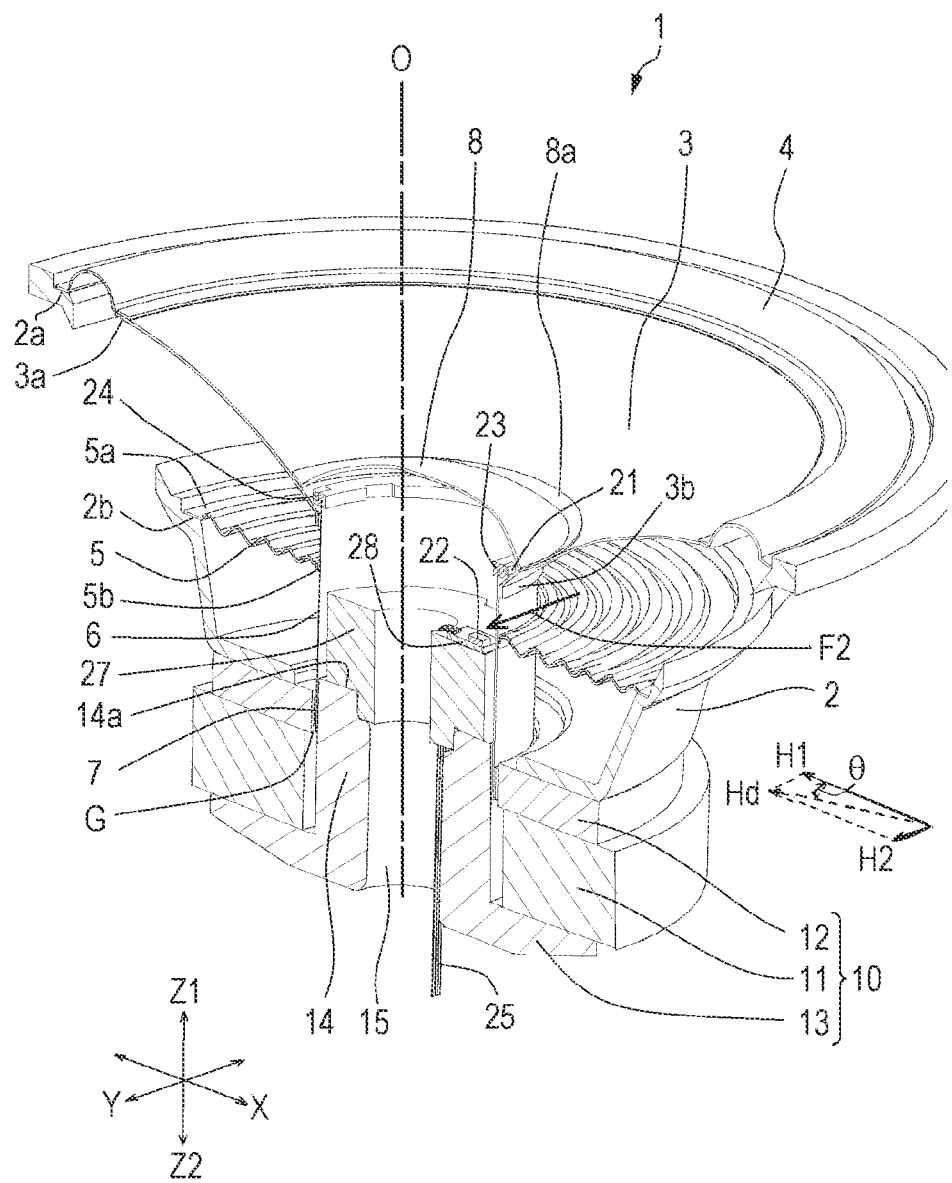
FIG. 1 is a sectional perspective view of a speaker according to a first embodiment of the present invention taken along a plane parallel to the X-Z plane.
Figure 2:
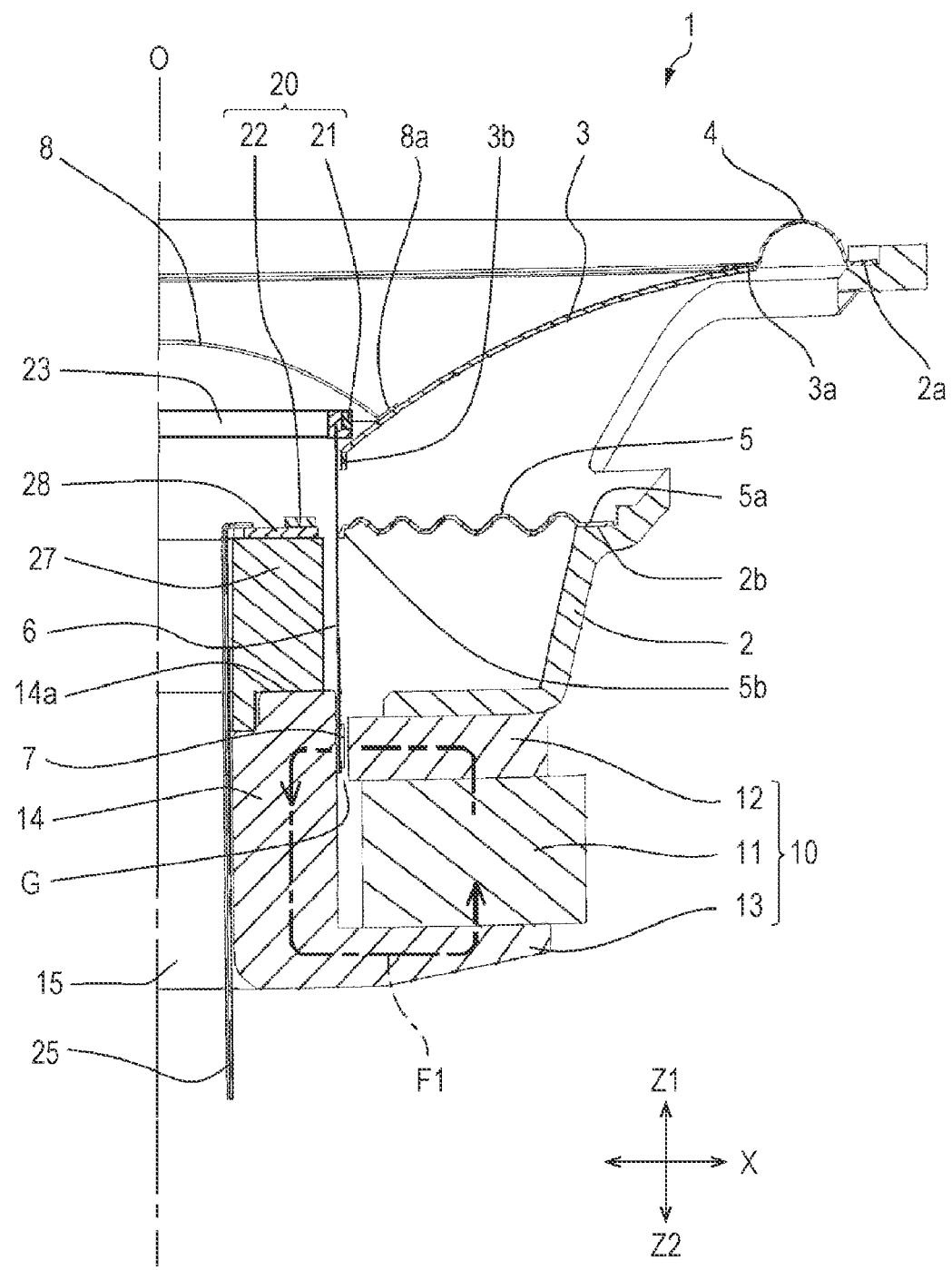
FIG. 2 is a half sectional view of the speaker according to the first embodiment taken along a plane parallel to the X-Z plane.

FIG. 1 and FIG. 2 illustrate a speaker 1 according to a first embodiment of the present invention. In the speaker 1, a Z1-Z2 direction is a front-back direction, a Z1 direction is a forward and sound output direction, and a Z2 direction is a backward direction. FIG. 1 and FIG. 2 show a central axis O extending in the front-back direction (Z1-Z2 direction). A main part of the speaker 1 has a substantially rotationally symmetrical structure centered on the central axis O. FIG. 1 shows an X axis and a Y axis orthogonal to each other in a plane orthogonal to the central axis O. The X axis coincides with the direction of a magnetic field H1 in a driving magnetic flux F1 formed by a magnetic circuit unit 10, and the Y axis coincides with the direction of a magnetic field H2 in a moving magnetic flux component F2 formed by a moving magnet 21. The magnetic field H1 and the magnetic field H2 are to be detected by a magnetic sensor 22.

The speaker 1 illustrated in FIG. 1 and FIG. 2 includes a frame 2. The frame 2 is formed of a non-magnetic material or a magnetic material. The frame 2 has a tapered shape with a diameter that gradually increases toward the front (in the Z1 direction). The magnetic circuit unit 10 is secured to the back (Z2 side) of the frame 2, for example, by bonding or with screws. The frame 2 and the magnetic circuit unit 10 constitute a drive supporting unit.

The magnetic circuit unit 10 includes an annular driving magnet 11 centered on the central axis O, an annular counter yoke 12 joined to the front of the driving magnet 11, and a back yoke 13 joined to the back of the driving magnet 11. A center yoke 14 is formed integrally with the back yoke 13. The center yoke 14 is disposed inside the driving magnet 11 and the counter yoke 12 and formed to protrude forward (in the Z1 direction) from the back yoke 13. The center yoke 14 may be formed independent of the back yoke 13 and joined to the back yoke 13. The center yoke 14 has a hole 15 passing therethrough in the front-back direction (Z1-Z2 direction). The counter yoke 12, the back yoke 13, and the center yoke 14 are formed of a magnetic material, that is, a magnetic metal material.

The center yoke 14 is a circular columnar member. The outer periphery of the center yoke 14 and the inner periphery of the counter yoke 12 have a magnetic gap G formed therebetween. The magnetic gap G is along the circumference centered on the central axis O. In the magnetic circuit unit 10, the driving magnetic flux F1 generated from the driving magnet 11 travels from the counter yoke 12 across the magnetic gap G and moves along the center yoke 14 and the back yoke 13.

A diaphragm 3 is disposed inside a space forward of the frame 2. The diaphragm 3 has a conical shape. A front edge 2a of the frame 2 and an outer edge 3a of the diaphragm 3 are joined to each other, with an elastically deformable edge member 4 therebetween. The front edge 2a is secured with an adhesive to the edge member 4, and the outer edge 3a is also secured with an adhesive to the edge member 4. The frame 2 internally has, in its middle part, an inner fixing portion 2b. An outer edge 5a of an elastically deformable damper member 5 having a corrugated cross-section is secured with an adhesive to the inner fixing portion 2b of the frame 2.

A bobbin 6 is disposed inside the frame 2. The bobbin 6 is a circular cylindrical member centered on the central axis O. An inner edge 3b of the diaphragm 3 is secured with an adhesive to an outer periphery of the bobbin 6, and an inner edge 5b of the damper member 5 is also secured with an adhesive to the outer periphery of the bobbin 6. A dome-shaped cap 8 that bulges forward is disposed in the center of the diaphragm 3. The cap 8 covers a front opening of the bobbin 6. An edge portion 8a of the cap 8 is secured with an adhesive to the front surface of the diaphragm 3.

A voice coil 7 is disposed on an outer periphery of a rear portion 6b (see FIG. 5B) of the bobbin 6 facing backward (in the Z2 direction). A coated wire constituting the voice coil 7 is wound a predetermined number of turns around the outer periphery of the bobbin 6. The voice coil 7 is disposed inside the magnetic gap G in the magnetic circuit unit 10. The magnetic circuit unit 10 and the voice coil 7 constitute a magnetic driving unit.

The diaphragm 3 and the bobbin 6 are supported by elastic deformation of the edge member 4 and the damper member 5 in such a way as to freely vibrate in the front-back direction (Z1-Z2 direction) with respect to the frame 2 (or with respect to the drive supporting unit). The diaphragm 3, the cap 8, the bobbin 6, and the voice coil 7 constitute a vibrating unit that vibrates in the front-back direction with respect to the drive supporting unit including the frame 2.

The speaker 1 includes a detecting unit (vibration detecting unit) 20 that detects vibration of a movable unit. The detecting unit 20 is constituted by the moving magnet 21 on the movable unit and the magnetic sensor 22 on the drive supporting unit. The moving magnet 21 is secured to a magnet support 23. The bobbin 6, the magnet support 23, and the moving magnet 21 are shown separately in FIG. 5A and FIG. 5B. The magnet support 23 is an annular member extending continuously over an angular range of 360 degrees and formed of a non-magnetic material, such as a synthetic resin material. The magnet support 23 is attached to a front edge 6a of the bobbin 6 facing forward (in the Z1 direction). That is, the magnet support 23 is attached to the front edge 6a of the bobbin 6 opposite the rear portion 6b having the voice coil 7 thereon.

The front edge 6a of the bobbin 6 has a plurality of positioning recesses 6c evenly spaced apart in the circumferential direction. As illustrated in FIG. 5B, the back surface of the annular magnet support 23 has arc-shaped grooves 23a at intervals, and adjacent ones of the grooves 23a are provided with a positioning protrusion 23b. That is, the grooves 23a and the positioning protrusions 23b are alternately arranged along the circumferential direction. The front edge 6a is inserted into the grooves 23a, the positioning protrusions 23b are inserted into the respective positioning recesses 6c, and the bobbin 6 and the magnet support 23 are secured with an adhesive. The front edge 6a of the bobbin 6 is fitted into the grooves 23a in the magnet support 23 to form a first fit, and the positioning protrusions 23b of the magnet support 23 are fitted into the positioning recesses 6c of the bobbin 6 to form a second fit, so that these fits serve as a positioning structure. The positioning structure allows positioning of the magnet support 23 and the bobbin 6 without causing their relative movement in the radial direction, the front-back direction, and the circumferential direction.

Figure 5A:
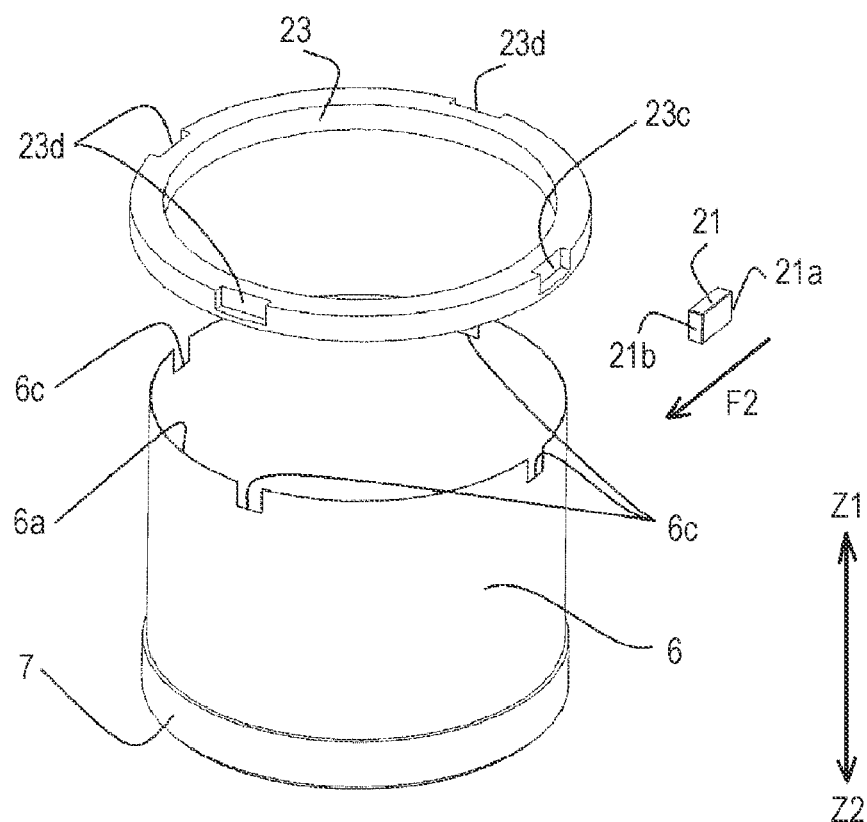
FIG. 5A and FIG. 5B illustrate a bobbin, a magnet support, and a moving magnet of the speaker according to the first and second embodiments, FIG. 5A being an exploded perspective view as viewed from above and FIG. 5B being an exploded perspective view as viewed from below.
Figure 5B:
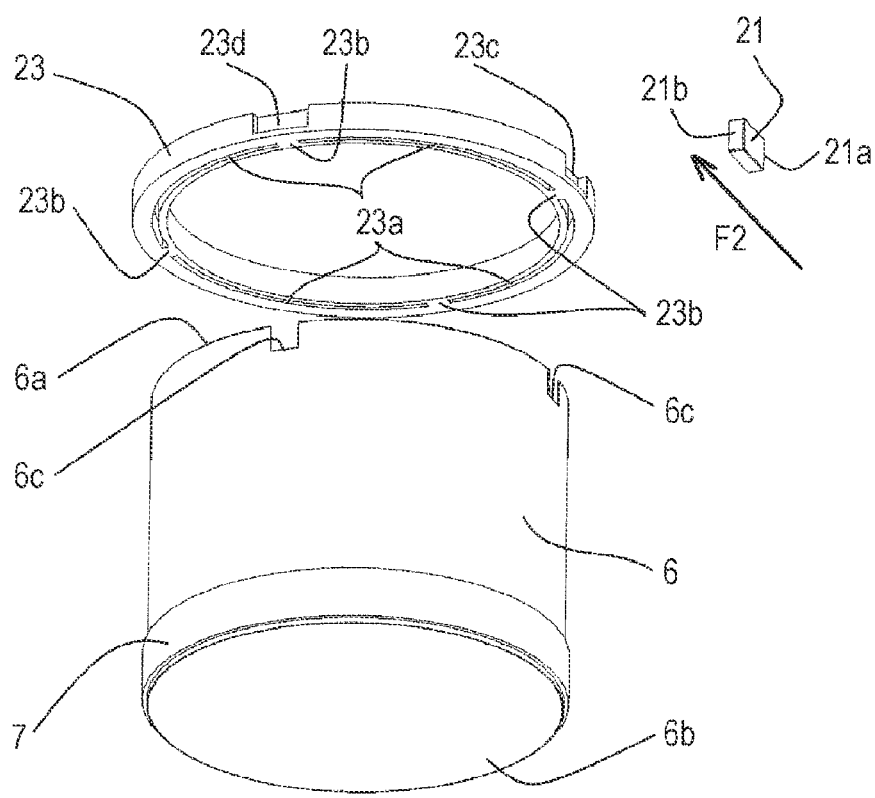

As illustrated in FIG. 5A, the magnet support 23 has a magnet retaining recess 23c formed in the front surface thereof. The magnet retaining recess 23c is a recessed portion that opens forward and outward in the radial direction. The moving magnet 21 is retained in, and secured with an adhesive to, the magnet retaining recess 23c. The magnet support 23 has at least one balancing-mass retaining recess 23d formed in the front surface thereof. A balancing mass 24 (see FIG. 1) is retained in, and secured with an adhesive to, the balancing-mass retaining recess 23d. The balancing mass 24 is designed to eliminate imbalance in mass on the bobbin 6 caused by mounting the moving magnet 21. The magnet support 23 is provided with at least one balancing mass 24. The balancing mass 24 is preferably spaced 180 degrees apart from the moving magnet 21 about the central axis O. It is more preferable, as illustrated in FIG. 5A, that there be a total of three balancing masses 24 (balancing-mass retaining recesses 23d), including two additional balancing masses 24 spaced 90 degrees apart from the moving magnet 21 about the central axis O. For example, the balancing masses 24 are made of metal or synthetic resin, and the balancing masses 24 each preferably have the same or substantially the same mass as the moving magnet 21. Note that it is also possible to form balancing masses 24 integrally with the magnet support 23, for example, by insert molding, without creating the balancing-mass retaining recesses 23d.

In the embodiments illustrated in FIG. 5A and FIG. 5B, the magnet support 23 is an annular member extending continuously over an angular range of 360 degrees. However, the magnet support 23 may be formed to extend along at least part of the bobbin 6 in the circumferential direction. For example, the magnet support 23 may be divided into arc-shaped portions, which are individually secured to the bobbin 6. In this case, for example, the arc-shaped portions include one having a length corresponding to a predetermined angle and formed with the magnet retaining recess 23c at the center, and another having a length corresponding to a predetermined angle and formed with the balancing-mass retaining recess 23d at the center.

As illustrated in FIG. 1 and FIG. 2, the magnetic sensor 22 constituting the detecting unit 20 is disposed in an interior space of the bobbin 6. A base 27 is bonded and secured to a front face 14a of the center yoke 14. The base 27 is a block-shaped member formed of a non-magnetic material, such as synthetic resin. A wiring board 28 is secured to the front surface of the base 27, and the magnetic sensor 22 is mounted on the front surface of the wiring board 28. The wiring board 28 also serves as a base. These bases (i.e., the base 27 and the wiring board 28) allow the magnetic sensor 22 to be disposed forward of and at a distance from the front face 14a of the center yoke 14 and, at the same time, close to the moving magnet 21. A distribution cable 25 electrically connected to the magnetic sensor 22 is connected to the wiring board 28. The distribution cable 25 passes through a hole in the center of the base 27 and the hole 15 in the center yoke 14 and extends outward from the back of the magnetic circuit unit 10.

FIG. 1 and FIG. 2 illustrate a cross-section of the speaker 1 taken along a plane parallel to the X-Z plane containing the central axis O. The center of the moving magnet 21 and the center of the magnetic sensor 22 are in the same cross-section containing the central axis O. In the driving magnetic flux F1 travelling inside the magnetic circuit unit 10, a leakage magnetic flux emerging forward of the magnetic circuit unit 10 contains a component acting on the magnetic sensor 22 in the radial direction (X direction). As illustrated in FIG. 5A and FIG. 5B, magnetized end faces 21a and 21b of the moving magnet 21 are oriented in the direction tangential to the bobbin 6 (in the direction parallel to the Y direction). If the end face 21a is north-polarized and the end face 21b is south-polarized, the moving magnetic flux component F2 indicated by an arrow in FIG. 5A and FIG. 5B acts on the back (Z2 side) of the moving magnet 21. The moving magnetic flux component F2 refers to a component of the magnetic flux generated by the moving magnet 21 and acts in the direction substantially tangential to the bobbin 6 (in the direction substantially parallel to the Y direction).

The magnetic sensor 22 is capable of detecting a change in the direction of a magnetic field, which is a vector quantity, in a plane orthogonal to the central axis O and passing through the center of the magnetic sensor 22 (in a plane parallel to the X-Y plane). The leakage magnetic flux of the driving magnetic flux F1 generated by the magnetic circuit unit 10 acts on the magnetic sensor 22 in the radial direction (X direction). In FIG. 1, the magnetic field (or vector quantity) acting on the magnetic sensor 22 in the X direction on the basis of the leakage magnetic flux of the driving magnetic flux F1 is denoted by H1. The moving magnetic flux component F2 generated by the moving magnet 21 acts on the magnetic sensor 22 in the Y direction. In FIG. 1, the magnetic field (or vector quantity) acting on the magnetic sensor 22 in the Y direction on the basis of the moving magnetic flux component F2 is denoted by H2. A detection output corresponding to a change in the direction of a detection magnetic field Hd, which is a composite vector of the magnetic field H1 and the magnetic field H2, is obtained from the magnetic sensor 22. Since the relative position of the magnetic sensor 22 and the magnetic circuit unit 10 does not change, there is virtually no change in the intensity of the magnetic field H1 acting on the magnetic sensor 22. On the other hand, since the distance between the moving magnet 21 and the magnetic sensor 22 changes as the movable unit vibrates in the front-back direction (Z1-Z2 direction), the intensity of the magnetic field H2 detected by the magnetic sensor 22 changes. Accordingly, the direction θ of the detection magnetic field Hd (composite vector), or the angle θ of the detection magnetic field Hd in a plane orthogonal to the central axis O, changes as the movable unit vibrates.

The magnetic sensor 22 includes at least one magnetoresistive element. The magnetoresistive element is a giant magnetoresistive (GMR) element or a tunneling magnetoresistive (TMR) element including a pinned magnetic layer and a free magnetic layer. The direction of magnetization of the pinned magnetic layer is fixed whereas the direction of the magnetic field in the free magnetic layer follows a change in the direction of the detection magnetic field Hd. An electrical resistance value thus changes in accordance with a change in the relative angle of the fixed magnetic field in the pinned magnetic layer and the magnetization of the free magnetic layer. A change in the angle θ of the vector of the detection magnetic field Hd can be detected in accordance with a change in this electrical resistance value. Alternatively, two Hall elements may be used as the magnetic sensor 22 to detect a change in the direction θ of the detection magnetic field Hd. In this case, the two Hall elements are arranged in such a way that the detection directions cross each other (preferably orthogonal to each other) in a plane orthogonal to the central axis O. Then, one of the Hall elements detects the intensity of the magnetic field H1 and the other Hall element detects the intensity of the magnetic field H2, so that a detection output corresponding to a change in the direction of the vector of the detection magnetic field Hd can be obtained.

A sound output operation of the speaker 1 will now be described.

In the sound output operation, a driving current is applied to the voice coil 7 on the basis of an audio signal output from an audio amplifier. Since the driving magnetic flux F1 generated from the magnetic circuit unit 10 travels across the voice coil 7, an electromagnetic force excited by the driving magnetic flux F1 and the driving current causes the vibrating unit including the bobbin 6 and the diaphragm 3 to vibrate in the front-back direction. This generates sound pressure corresponding to the frequency of the driving current, and enables sound to be output toward the front.

A control unit connected to the speaker 1 performs feedback control on the basis of a detection output from the magnetic sensor 22. By obtaining, from the magnetic sensor 22, a detection output based on a change in the angle θ of the detection magnetic field Hd in a plane, the control unit can identify the position of the vibrating unit including the diaphragm 3 in the front-back direction and can also identify the change in this position. For example, the control unit determines an ideal position of the vibrating unit in the front-back direction achieved by application of an audio signal and a change in this ideal position, and also determines an actual position of the vibrating unit and a change in this actual position from the detection output from the magnetic sensor 22. The control unit then calculates the amount of deviation of the actual position and its change from the ideal position and its change. If the amount of deviation exceeds a threshold, a correction signal (offset signal) for correcting the deviation is generated. The correction signal is superimposed on the driving signal (voice current) applied to the voice coil 7. The feedback control thus corrects distortion and deviation of sound output from the speaker 1, and prevents excessive vibration of the diaphragm 3 in the front-back direction.

The magnetic sensor 22 detects a change in the angle of the detection magnetic field Hd, which is a composite vector quantity of the leakage magnetic flux of the driving magnetic flux F1 generated by the magnetic circuit unit 10 and the moving magnetic flux component F2 generated by the moving magnet 21. That is, the magnetic sensor 22 obtains a detection output using a detection component of the leakage magnetic flux of the driving magnetic flux F1 from the magnetic circuit unit 10. Therefore, the leakage magnetic flux of the driving magnetic flux F1 does not obstruct the detection of the position of the movable unit, and does not cause noise. Feedback control can thus be always performed with high precision and sensitivity.

The speaker 1 illustrated in FIG. 1 and FIG. 2 can be assembled by the following process. The driving magnet 11 is magnetized in advance, and the counter yoke 12 and the back yoke 13 are joined to the magnetized driving magnet 11 to form the magnetic circuit unit 10. Alternatively, a ferromagnetic body to be formed into the driving magnet 11 may be joined to the counter yoke 12 and the back yoke 13 before being magnetized to form the driving magnet 11. It is also possible that after a ferromagnetic body is joined to the counter yoke 12 and the back yoke 13, the counter yoke 12 is further joined to the frame 2 to form the drive supporting unit before the ferromagnetic body is magnetized to form the driving magnet 11. The moving magnet 21 is secured to the magnet support 23 after being independently magnetized. Alternatively, after a ferromagnetic body to be formed into the moving magnet 21 is secured to the magnet support 23, the ferromagnetic body may be magnetized to form the moving magnet 21. As described, the driving magnet 11 and the moving magnet 21 are magnetized in processes independent of each other. Therefore, the magnetizing process for one magnet has no influence on the magnetized state of the other magnet.

In the process of assembling the speaker 1, the magnetic circuit unit 10 and the frame 2 are joined together, and the wiring board 28 and the magnetic sensor 22 are mounted in place to form the drive supporting unit. With a jig, the bobbin 6 having the voice coil 7 wound therearound is inserted into and positioned inside the magnetic gap G in the magnetic circuit unit 10. Then, the outer edge 5a of the damper member 5 is bonded to the frame 2, and the inner edge 5b of the damper member 5 is bonded to the outer periphery of the bobbin 6. Additionally, the outer edge 3a of the diaphragm 3 is bonded to the frame 2 and the inner edge 3b of the diaphragm 3 is bonded to the outer periphery of the bobbin 6. After completion of this basic structure of the speaker 1, the magnet support 23 having the moving magnet 21 and the balancing mass 24 secured thereto is mounted onto the front edge 6a of the bobbin 6 protruding forward from the center of the diaphragm 3. The bobbin 6 is then bonded and secured to the magnet support 23. This is followed by bonding the edge portion 8a of the cap 8 to the front surface of the center part of the diaphragm 3. In this assembling process, the magnet support 23 is secured to the front edge 6a of the bobbin 6 protruding forward of the diaphragm 3 after completion of the basic structure of the speaker 1. The moving magnet 21 can therefore be easily positioned and attached to the bobbin 6.

In the process of assembling the speaker 1, the magnet support 23 may be secured to the bobbin 6 in advance. In this case, for example, after the bobbin 6 having the magnet support 23 secured thereto is inserted into and positioned inside the magnetic gap G in the magnetic circuit unit 10 using a jig, the damper member 5 and the diaphragm 3 are attached to the bobbin 6.

In the speaker 1 illustrated in FIG. 1 and FIG. 2, the moving magnet 21 is positioned at the magnet support 23, which is positioned and secured to the front edge 6a of the bobbin 6. Therefore, the relative position of the moving magnet 21 and the magnetic sensor 22 can be determined without variation. It is thus possible to make the direction and intensity of the moving magnetic flux component F2 acting from the moving magnet 21 on the magnetic sensor 22 constant, and minimize variation in feedback control in each product.

In the speaker 1, the moving magnet 21 is attached to the front edge 6a of the bobbin 6 forward (on the Z1 side) of the damper member 5. Therefore, even when the amplitude of the vibrating unit in the front-back direction increases and the bobbin 6 moves backward (in the Z2 direction) significantly, the moving magnet 21 does not become very close to the magnetic circuit unit 10. Since the moving magnet 21 is prevented from being magnetically attracted to the counter yoke 12 of the magnetic circuit unit 10, it is unlikely that the magnetism of the moving magnet 21 will be reduced.

The magnet support 23 is shaped to extend along the circumference of the bobbin 6. The bobbin 6, which is thus reinforced by the magnet support 23, is less likely to be deformed, and it is less likely that the circular cylindrical shape of the bobbin 6 and the voice coil 7 will be distorted. Also, since the balancing mass 24 for balancing with the moving magnet 21 is secured to the magnet support 23, imbalance in the mass of the movable unit can be corrected. It is also possible to reduce occurrence of rolling which is caused, for example, by displacement of the center of gravity during operation of the movable unit.

Figure 3:
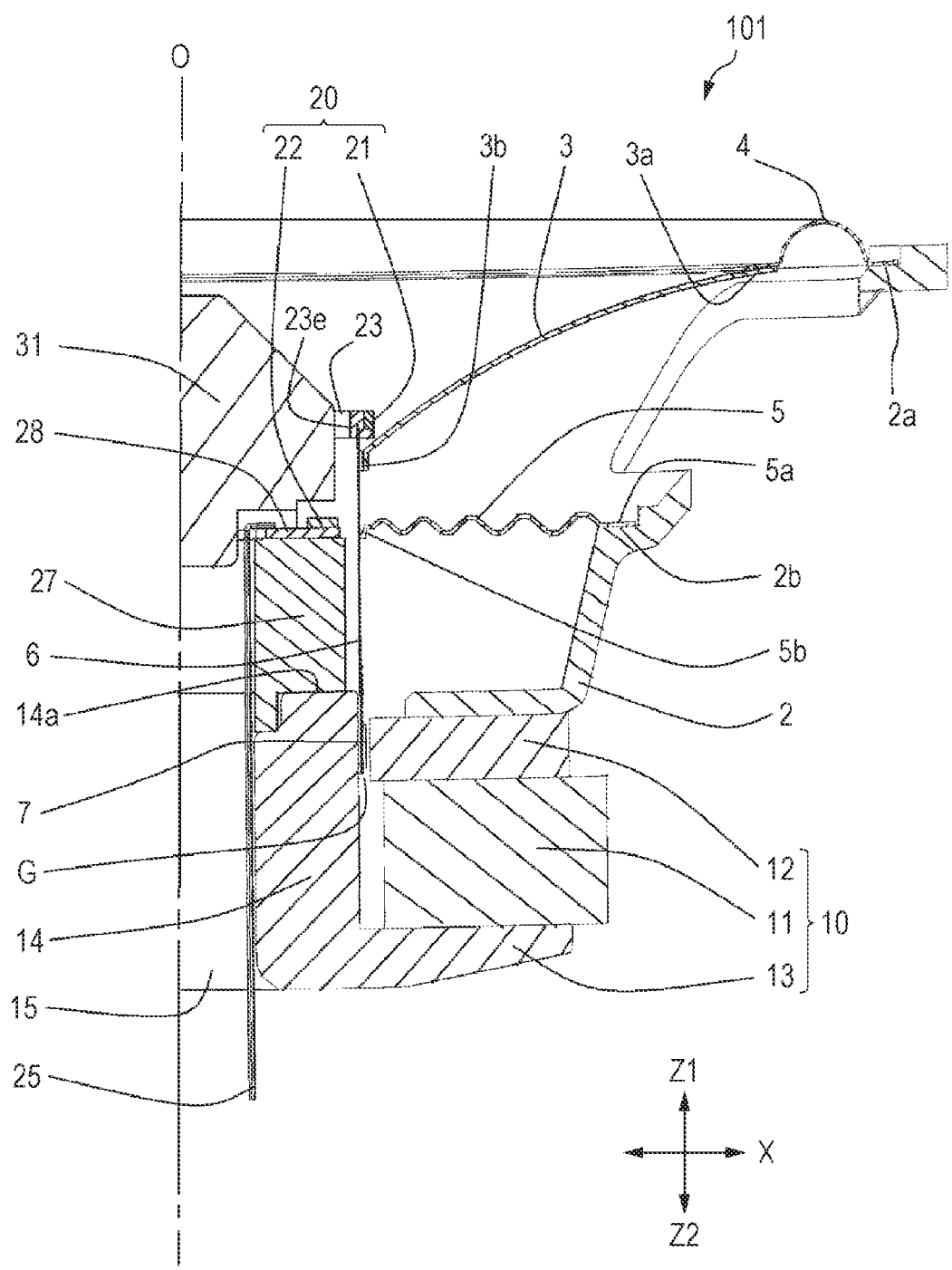
FIG. 3 is a half sectional view of a speaker according to a second embodiment of the present invention taken along a plane parallel to the X-Z plane.
Figure 6:
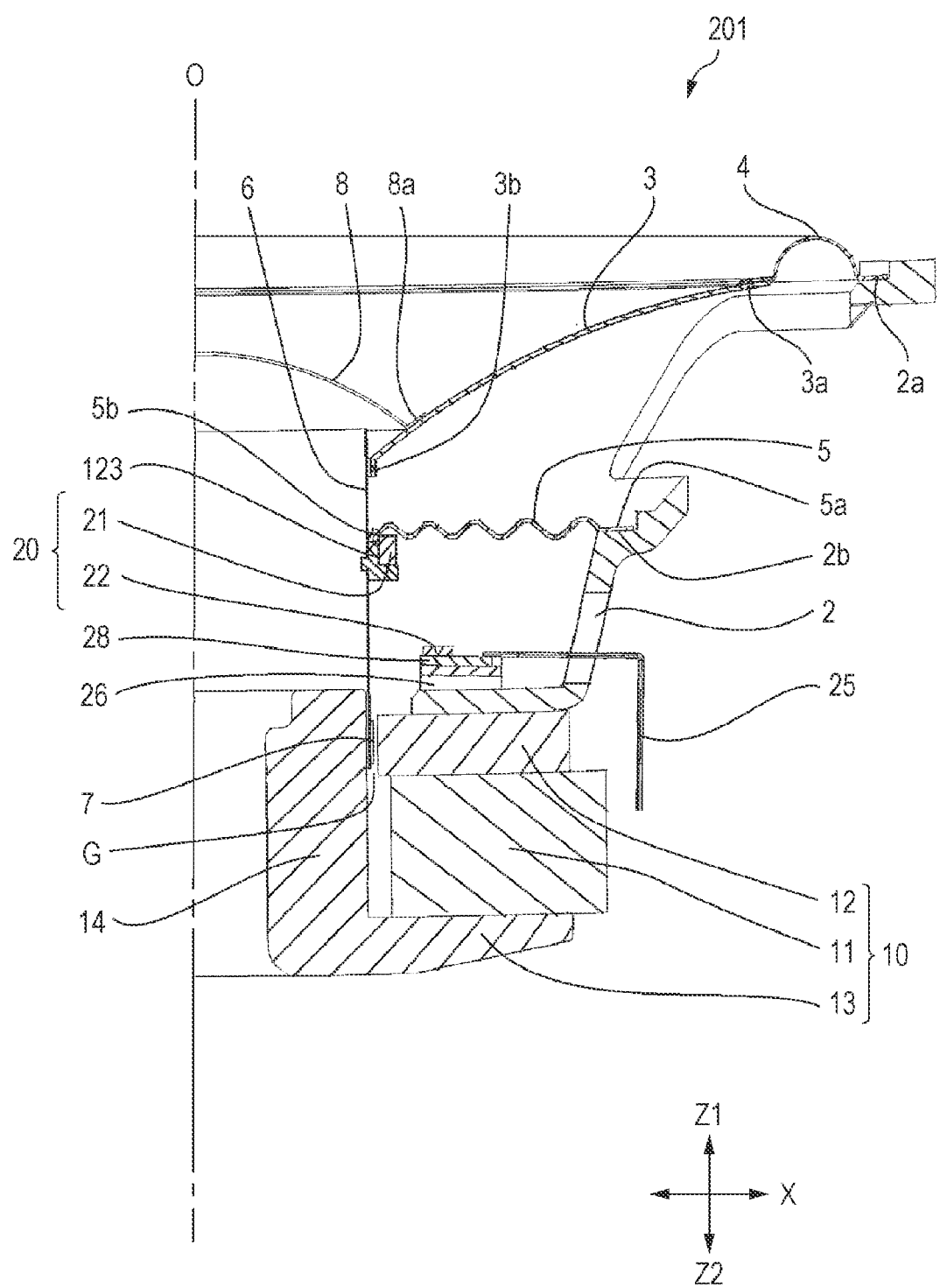
FIG. 6 is a half sectional view of a speaker according to a third embodiment of the present invention taken along a plane parallel to the X-Z plane.
Figure 8:
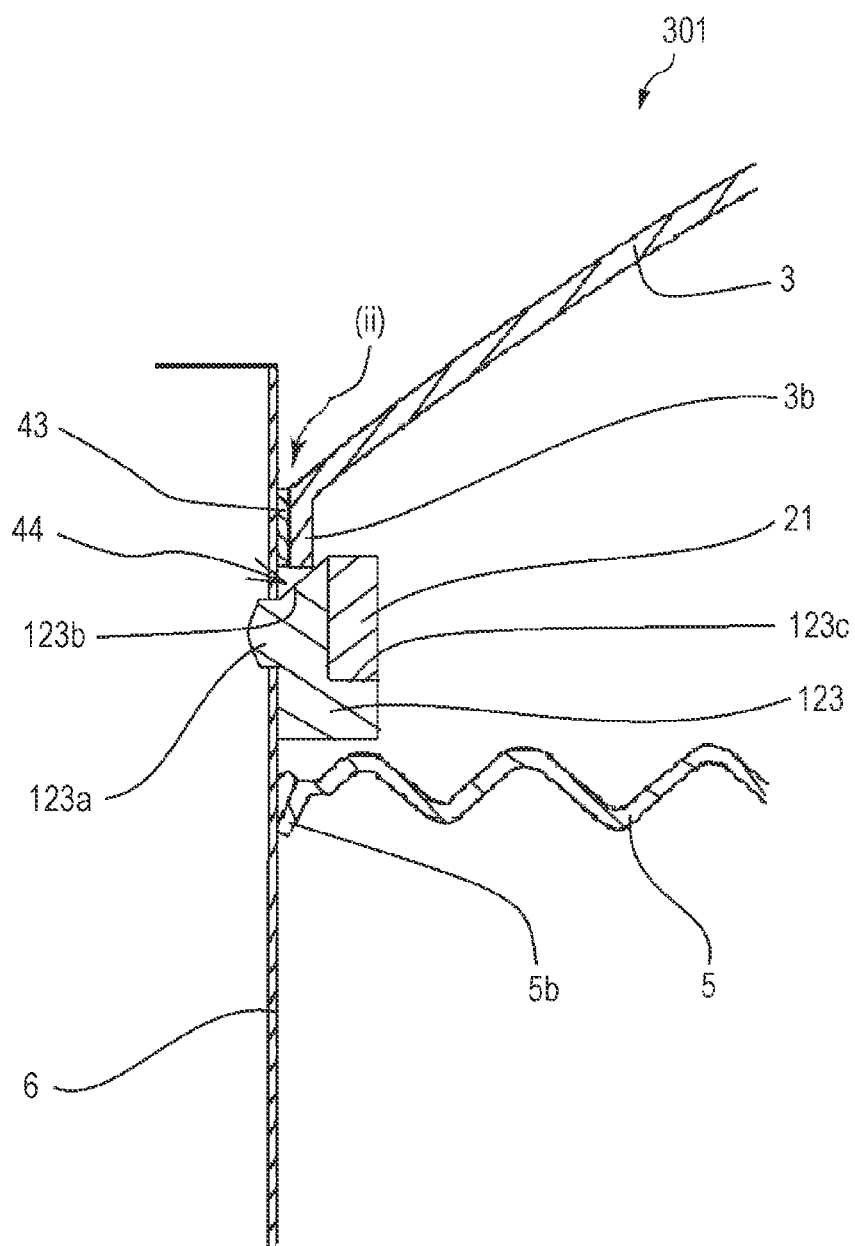
FIG. 8 is a partial enlarged sectional view of a speaker according to a fourth embodiment of the present invention taken along a plane parallel to the X-Z plane.

FIG. 3 illustrates a speaker 101 according to a second embodiment of the present invention, FIG. 6 illustrates a speaker 201 according to a third embodiment of the present invention, and FIG. 8 illustrates a speaker 301 according to a fourth embodiment of the present invention. In the second, third, and fourth embodiments, the same component parts as those of the speaker 1 according to the first embodiment illustrated in FIG. 1 and FIG. 2 are denoted by the same reference numerals and detailed description thereof will be omitted.

In the speaker 101 of the second embodiment illustrated in FIG. 3, a phase plug 31 is secured forward of the base 27 that supports the magnetic sensor 22. The speaker 101 does not include the cap 8. When viewed from the front, the magnet support 23 is exposed on the outer periphery of the phase plug 31. The inner periphery of the magnet support 23 serves as a positioning portion (positioning face) 23e for determining the relative position with respect to the phase plug 31.

Figure 4:
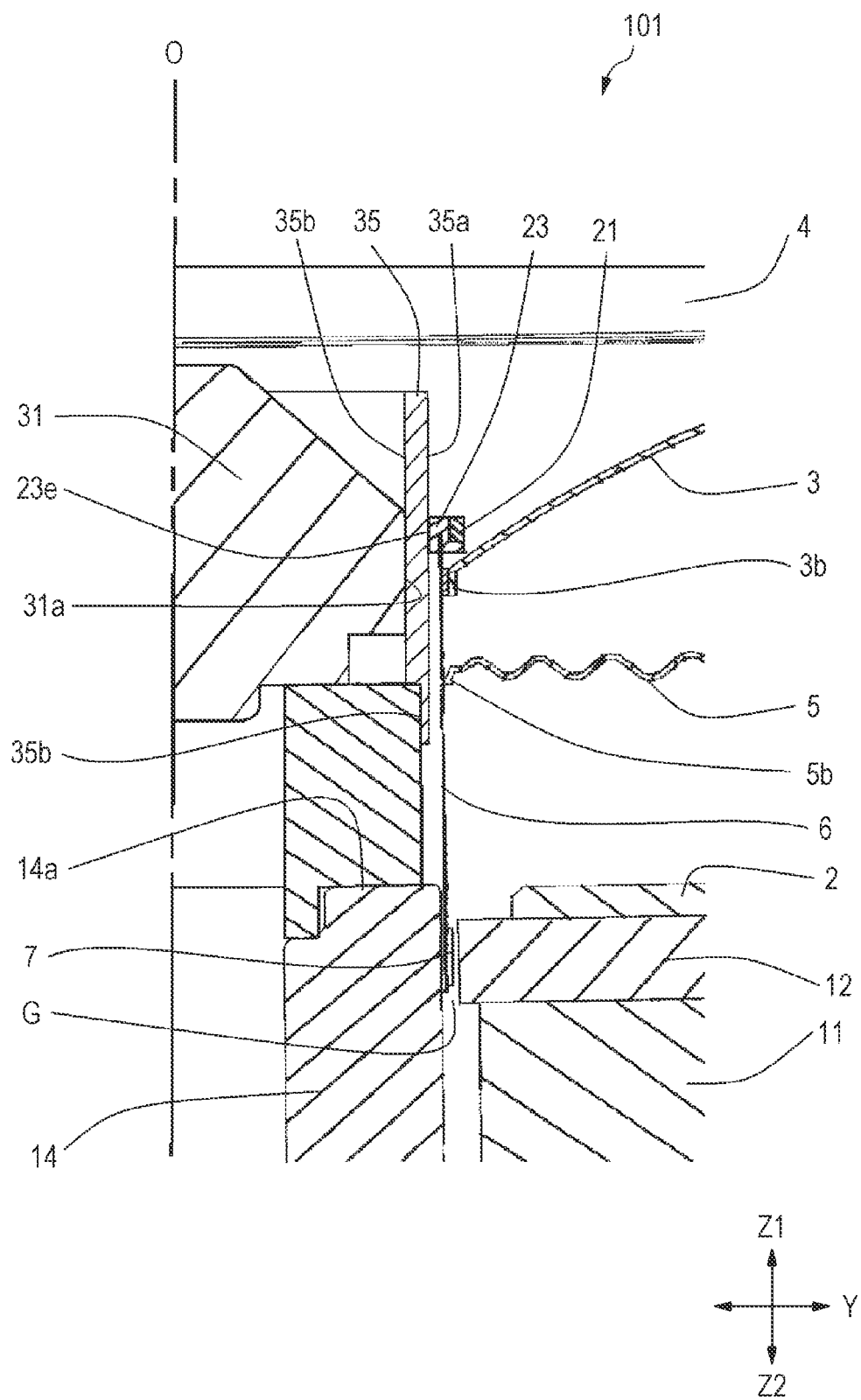
FIG. 4 is an explanatory diagram illustrating an operation of assembling the speaker according to the second embodiment, the diagram being a partial enlarged half sectional view taken along a plane parallel to the Y-Z plane.

In the process of assembling the speaker 101, as illustrated in FIG. 4, a positioning jig 35 having a circular cylindrical shape is installed inside the bobbin 6 at some point in time. The magnet support 23 and the phase plug 31 are mounted in place, with an outer periphery 35a and an inner periphery 35b of the positioning jig 35 being in firm contact with the positioning portion 23e (inner periphery) of the magnet support 23 and the outer periphery 31a of the phase plug 31, respectively. This process enables the center of the bobbin 6 to coincide with the center of the phase plug 31. Also, after the assembly, a uniform gap can be created between the inner periphery of the magnet support 23 and the outer periphery 31a of the phase plug 31 over the entire circumference of the phase plug 31. This makes it less likely that the bobbin 6 will hit the phase plug 31 when the bobbin 6 vibrates back and forth in the sound output operation.

Figure 7:
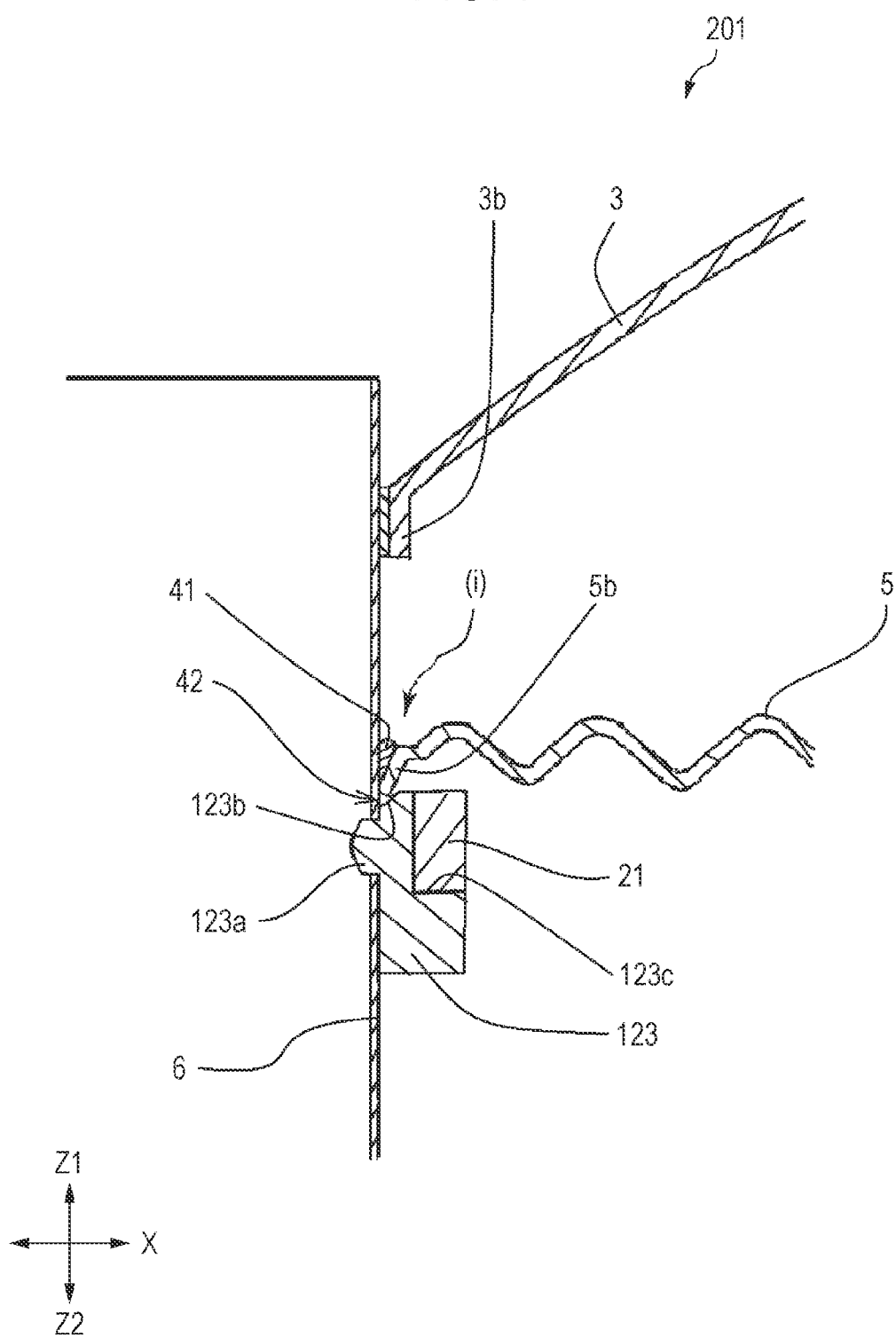
FIG. 7 is an enlarged sectional view of a part of FIG. 6.
Figure 9:
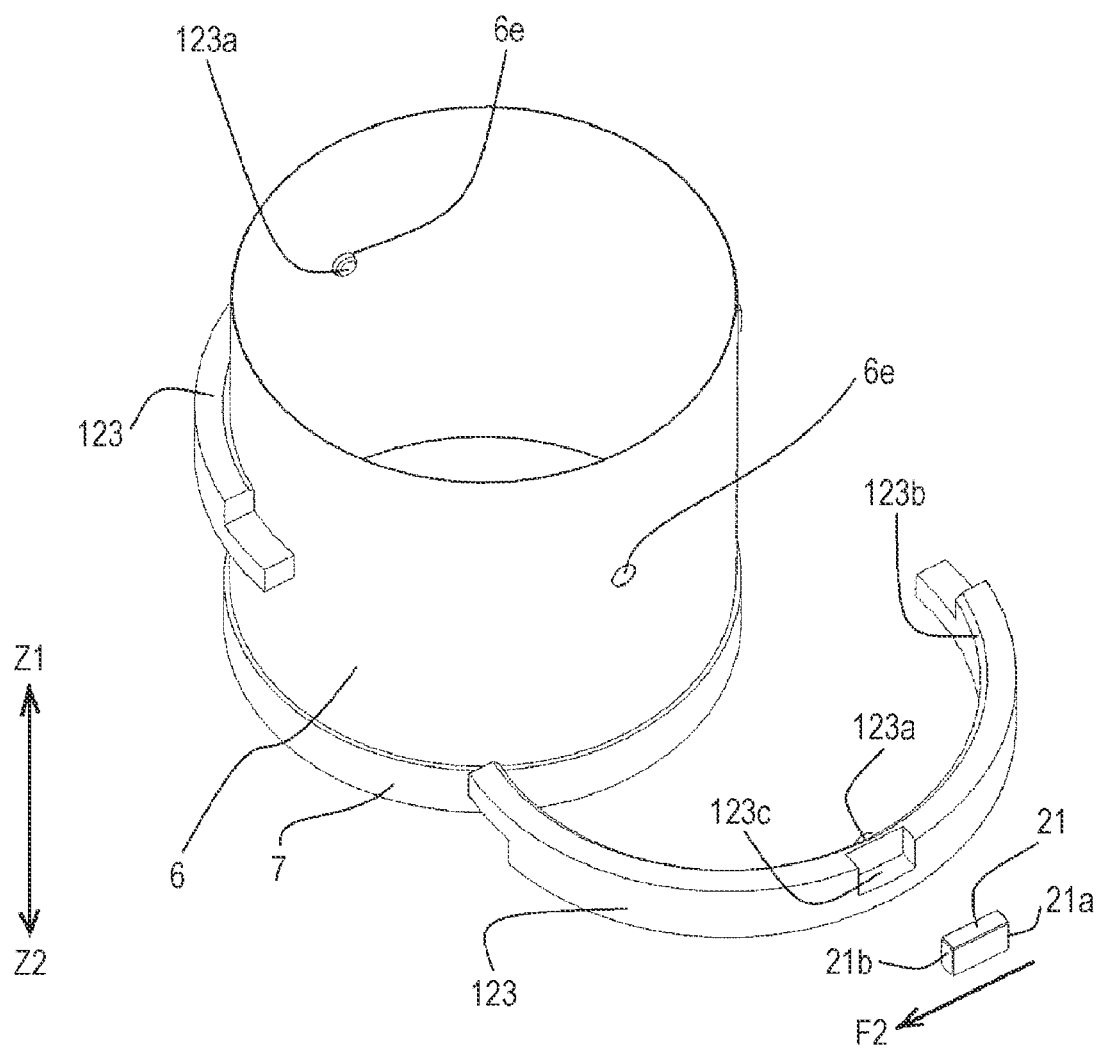
FIG. 9 is an exploded perspective view of a bobbin, a magnet support, and a moving magnet of the speaker according to the third and fourth embodiments, as viewed from above.

In the speaker 201 of the third embodiment illustrated in FIG. 6 and FIG. 7, a magnet support 123 on the outer periphery of the bobbin 6 is located in a middle part of the bobbin 6 in the front-back direction (Z1-Z2 direction). As illustrated in FIG. 9, the magnet support 123 is composed of two separate pieces, each of which is formed of a non-magnetic material, such as a synthetic resin material, and has a positioning protrusion 123a integrally formed on the inner periphery thereof. The bobbin 6 has positioning holes 6e, which are each open at a position corresponding to the positioning protrusion 123a. The positioning protrusions 123a and the positioning holes 6e constitute a positioning structure for positioning the bobbin 6 and the magnet support 123. After the positioning protrusions 123a are inserted into the respective positioning holes 6e, the two separate pieces of the magnet support 123 are bonded to the outer periphery of the bobbin 6. Then, the two separate pieces of the magnet support 123 are bonded and joined together to form the magnet support 123 having an annular shape that extends over the entire circumference of the bobbin 6. The two separate pieces of the magnet support 123 may be spaced apart in the circumferential direction and bonded in a discontinuous state to the outer periphery of the bobbin 6.

As illustrated in FIG. 6, FIG. 7, and FIG. 9, the magnet support 123 has a magnet retaining recess 123c, in which the moving magnet 21 is positioned and secured. The magnet support 123 preferably has a balancing-mass retaining recess which allows the balancing mass 24 to be positioned and secured therein.

FIG. 7 is an enlarged sectional view of a joint between the bobbin 6 and the magnet support 123 and a joint (i) between the bobbin 6 and the damper member 5. A tapered surface 123b is formed at the front of the inner periphery of the magnet support 123, and a gap portion 42 that gradually widens toward the front is formed between the outer periphery of the bobbin 6 and the tapered surface 123b. At the joint (i), the inner edge 5b of the damper member 5 is bonded with an adhesive 41 to the outer periphery of the bobbin 6. The magnet support 123 is disposed immediately behind the joint (i), and a part of the inner edge 5b of the damper member 5 is positioned in the gap portion 42 between the bobbin 6 and the magnet support 123. By positioning the part of the inner edge 5b in the gap portion 42, positioning of the inner edge 5b of the damper member 5 in the rearward direction (Z2 direction) can be performed, and the inner edge 5b can be bonded to the bobbin 6 after the positioning.

As illustrated in FIG. 6, in the speaker 201 of the third embodiment, a base 26 formed of a non-magnetic material is secured to the frame 2 in a region outside the bobbin 6. The wiring board 28 is secured to the front surface of the base 26, and the magnetic sensor 22 is mounted on the front surface of the wiring board 28. The magnetic sensor 22 of the speaker 201 has the same function of detecting magnetic fields as, for example, the speaker 1 of the first embodiment illustrated in FIG. 1.

In the speaker 201 of the third embodiment illustrated in FIG. 6 and FIG. 7, the magnet support 123 having an annular shape reinforces the middle part of the bobbin 6 in the front-back direction. This makes the bobbin 6 less likely to be distorted and makes it easier to maintain the circular cylindrical shape of the bobbin 6. Also, since the joint (i) between the bobbin 6 and the damper member 5 is reinforced or protected by the magnet support 123, the joint (i) is less likely to be damaged. The moving magnet 21 is retained by the magnet support 123. Therefore, when the bobbin 6 moves backward (in the Z2 direction) significantly, even if the magnet support 123 hits the magnetic circuit unit 10, the moving magnet 21 is prevented from directly hitting the magnetic circuit unit 10.

In the speaker 301 of the fourth embodiment illustrated in FIG. 8, the magnet support 123 having an annular shape is disposed forward of the damper member 5 and immediately behind a joint (ii) between the bobbin 6 and the diaphragm 3. In the joint (ii), the outer periphery of the bobbin 6 is secured with an adhesive 43 to the inner edge 3b of the diaphragm 3. A gap portion 44 is formed between the tapered surface 123b of the magnet support 123 and the outer periphery of the bobbin 6. A part of the inner edge 3b of the diaphragm 3 is in the gap portion 44, and the joint (ii) is protected by the magnet support 123. Before the inner edge 3b of the diaphragm 3 is bonded to the bobbin 6, positioning of the diaphragm 3 in the rearward direction (Z2 direction) can be performed.

The speaker 301 has the same structure as the speaker 201 of the third embodiment illustrated in FIG. 6, except the position of the magnet support 123. In the speaker 301, the magnet support 123 is disposed forward of the damper member 5. Therefore, even when the bobbin 6 moves backward (in the Z2 direction) significantly, the moving magnet 21 is not magnetically attracted to the magnetic circuit unit 10 and the magnetized state of the moving magnet 21 is not changed. It is unlikely that the moving magnet 21 will be damaged by colliding with the magnetic circuit unit 10.

While there has been illustrated and described what is at present contemplated to be preferred embodiments of the present invention, it will be understood by those skilled in the art that various changes and modifications may be made, and equivalents may be substituted for elements thereof without departing from the true scope of the invention. In addition, many modifications may be made to adapt a particular situation to the teachings of the invention without departing from the central scope thereof. Therefore, it is intended that this invention not be limited to the particular embodiments disclosed, but that the invention will include all embodiments falling within the scope of the appended claims.

What is claimed is:

1. A speaker comprising:
    a vibrating unit including a diaphragm supported by a frame, a bobbin configured to vibrate with the diaphragm, and a voice coil disposed on the bobbin; and
    a drive supporting unit including the frame and a magnetic circuit unit configured to apply a magnetic flux to the voice coil,
    wherein the speaker includes a detecting unit including a moving magnet and a magnetic sensor; and
    a magnet support made of a non-magnetic material is attached to the bobbin having a circular cylindrical shape, the magnet support extends along at least part of the bobbin in a circumferential direction, the moving magnet is secured to the magnet support, and the magnetic sensor is secured to the drive supporting unit.

2. The speaker according to claim 1, wherein the magnet support has an annular shape extending along an entire circumference of the bobbin.

3. The speaker according to claim 1, wherein a balancing mass is secured to the magnet support, the balancing mass being configured to eliminate imbalance in mass caused by securing the moving magnet to the magnet support.

4. The speaker according to claim 1, wherein the magnet support is attached to extend along a front edge of the bobbin, the front edge being on a side of the bobbin opposite the voice coil.

5. The speaker according to claim 4, wherein a phase plug supported by the magnetic circuit unit is provided in a region surrounded by the bobbin; and
    an inner periphery of the magnet support serves as a positioning portion that determines a relative position with respect to the phase plug.

6. The speaker according to claim 1, wherein the magnet support is secured to an outer periphery of the bobbin in a middle part of the bobbin in a front-back direction.

7. The speaker according to claim 6, wherein a damper member is provided between the frame and the bobbin; and
    the magnet support is attached to extend along a joint between the bobbin and the damper member.

8. The speaker according to claim 6, wherein the magnet support is attached to extend along a joint between the bobbin and the diaphragm.

9. The speaker according to claim 1, wherein the magnet support and the bobbin have a positioning structure configured to restrict relative displacement of the bobbin in the circumferential direction.

10. The speaker according to claim 1, wherein a direction of a magnetic field applied from the magnetic circuit unit to the magnetic sensor crosses a direction of a magnetic field applied from the moving magnet to the magnetic sensor; and
    a detection output based on a change in a direction of a composite vector of the two magnetic fields is obtained from the magnetic sensor.

11. A speaker comprising:
    a vibrating unit including a diaphragm supported by a frame, a bobbin configured to vibrate with the diaphragm, and a voice coil disposed on the bobbin; and
    a drive supporting unit including the frame and a magnetic circuit unit configured to apply a magnetic flux to the voice coil,
    wherein the speaker includes a detecting unit including a moving magnet and a magnetic sensor;
    a magnet support made of a non-magnetic material is attached to the bobbin having a circular cylindrical shape, the magnet support extends along at least part of the bobbin in a circumferential direction, the moving magnet is secured to the magnet support, and the magnetic sensor is secured to the drive supporting unit;
    a direction of a magnetic field applied from the magnetic circuit unit to the magnetic sensor crosses a direction of a magnetic field applied from the moving magnet to the magnetic sensor; and
    a detection output based on a change in a direction of a composite vector of the two magnetic fields is obtained from the magnetic sensor.

12. The speaker according to claim 11, wherein the magnet support has an annular shape extending along an entire circumference of the bobbin.

13. The speaker according to claim 11, wherein a balancing mass is secured to the magnet support, the balancing mass being configured to eliminate imbalance in mass caused by securing the moving magnet to the magnet support.

14. The speaker according to claim 11, wherein the magnet support is attached to extend along a front edge of the bobbin, the front edge being on a side of the bobbin opposite the voice coil.

15. The speaker according to claim 14, wherein a phase plug supported by the magnetic circuit unit is provided in a region surrounded by the bobbin; and an inner periphery of the magnet support serves as a positioning portion that determines a relative position with respect to the phase plug.

16. The speaker according to claim 11, wherein the magnet support is secured to an outer periphery of the bobbin in a middle part of the bobbin in a front-back direction.

17. The speaker according to claim 16, wherein a damper member is provided between the frame and the bobbin; and the magnet support is attached to extend along a joint between the bobbin and the damper member.

18. The speaker according to claim 16, wherein the magnet support is attached to extend along a joint between the bobbin and the diaphragm.

19. The speaker according to claim 11, wherein the magnet support and the bobbin have a positioning structure configured to restrict relative displacement of the bobbin in the circumferential direction.

* * * * *